(12) United States Patent
Naem

(10) Patent No.: US 8,324,097 B2
(45) Date of Patent: Dec. 4, 2012

(54) METHOD OF FORMING A COPPER TOPPED INTERCONNECT STRUCTURE THAT HAS THIN AND THICK COPPER TRACES

(75) Inventor: Abdalla Aly Naem, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 457 days.

(21) Appl. No.: 12/751,894

(22) Filed: Mar. 31, 2010

(65) Prior Publication Data

US 2010/0190332 A1   Jul. 29, 2010

Related U.S. Application Data

(62) Division of application No. 12/283,852, filed on Sep. 15, 2008, now Pat. No. 7,709,956.

(51) Int. Cl.
*H01L 21/283* (2006.01)

(52) U.S. Cl. ............... 438/654; 438/687; 257/E21.584; 257/E21.586

(58) Field of Classification Search .................. 438/687, 438/654; 257/E21.575, E21.584, E21.585, 257/E21.586
See application file for complete search history.

(56) References Cited

U.S. PATENT DOCUMENTS

| | | | | |
|---|---|---|---|---|
| 5,254,493 A * | 10/1993 | Kumar | ............................. | 216/16 |
| 5,550,405 A * | 8/1996 | Cheung et al. | ................. | 257/642 |
| 5,728,594 A * | 3/1998 | Efland et al. | ................... | 438/128 |
| 5,891,805 A * | 4/1999 | Cheng et al. | ................... | 438/696 |
| 6,020,640 A * | 2/2000 | Efland et al. | ................... | 257/751 |
| 6,025,275 A * | 2/2000 | Efland et al. | ................... | 438/722 |
| 6,046,071 A * | 4/2000 | Sawai et al. | .................... | 438/106 |
| 6,090,697 A * | 7/2000 | Xing et al. | ...................... | 438/618 |
| 6,133,133 A * | 10/2000 | Givens | .......................... | 438/597 |
| 6,140,150 A * | 10/2000 | Efland et al. | ................... | 438/106 |
| 6,140,702 A * | 10/2000 | Efland et al. | ................... | 257/762 |
| 6,150,722 A * | 11/2000 | Efland et al. | ................... | 257/762 |
| 6,197,688 B1 * | 3/2001 | Simpson | ....................... | 438/678 |
| 6,236,101 B1 * | 5/2001 | Erdeljac et al. | ................. | 257/531 |
| 6,294,474 B1 * | 9/2001 | Tzeng et al. | ................... | 438/710 |
| 6,316,359 B1 * | 11/2001 | Simpson | ....................... | 438/678 |
| 6,372,586 B1 * | 4/2002 | Efland et al. | ................... | 438/301 |
| 6,407,453 B1 * | 6/2002 | Watanabe et al. | ............. | 257/758 |
| 6,521,533 B1 * | 2/2003 | Morand et al. | ................. | 438/687 |
| 6,559,548 B1 * | 5/2003 | Matsunaga et al. | ........... | 257/774 |
| 6,638,792 B2 * | 10/2003 | Hui et al. | ....................... | 438/118 |
| 6,713,381 B2 * | 3/2004 | Barr et al. | ...................... | 438/622 |
| 6,743,719 B1 * | 6/2004 | Chen et al. | .................... | 438/658 |
| 6,750,553 B2 * | 6/2004 | Abesingha et al. | ........... | 257/787 |
| 6,943,101 B2 * | 9/2005 | Brintzinger | ................... | 438/613 |
| 7,071,024 B2 * | 7/2006 | Towle et al. | ................... | 438/106 |
| 7,087,991 B2 * | 8/2006 | Chen et al. | .................... | 257/700 |
| 7,101,809 B2 * | 9/2006 | Jo | ................................. | 438/754 |
| 7,105,917 B2 * | 9/2006 | Cho et al. | ...................... | 257/678 |
| 7,132,297 B2 * | 11/2006 | Griglione et al. | ................ | 438/3 |
| 7,148,141 B2 * | 12/2006 | Shim et al. | .................... | 438/667 |
| 7,262,126 B2 * | 8/2007 | Bojkov et al. | ................. | 438/618 |
| 7,271,013 B2 * | 9/2007 | Yong et al. | ...................... | 438/14 |

(Continued)

*Primary Examiner* — Mary Wilczewski

(74) *Attorney, Agent, or Firm* — Eugene C. Conser; Wade J. Brady, III; Frederick J. Telecky, Jr.

(57) ABSTRACT

A copper-topped interconnect structure allows the combination of high density design areas, which have low current requirements that can be met with tightly packed thin and narrow copper traces, and low density design areas, which have high current requirements that can be met with more widely spaced thick and wide copper traces, on the same chip.

12 Claims, 5 Drawing Sheets

U.S. PATENT DOCUMENTS

| | | | |
|---|---|---|---|
| 7,323,406 B2* | 1/2008 | Lim et al. | 438/622 |
| 7,709,956 B2* | 5/2010 | Naem et al. | 257/758 |
| 2001/0034119 A1* | 10/2001 | Morozumi | 438/622 |
| 2002/0084526 A1* | 7/2002 | Kasai | 257/758 |
| 2002/0102831 A1* | 8/2002 | Hui et al. | 438/611 |
| 2003/0025173 A1* | 2/2003 | Suminoe et al. | 257/459 |
| 2003/0076715 A1* | 4/2003 | Ikuta et al. | 365/200 |
| 2003/0205810 A1* | 11/2003 | Usami | 257/751 |
| 2004/0026786 A1* | 2/2004 | Leu et al. | 257/758 |
| 2004/0070042 A1* | 4/2004 | Lee et al. | 257/459 |
| 2005/0017355 A1* | 1/2005 | Chou et al. | 257/738 |
| 2005/0064606 A1* | 3/2005 | Pellizzer et al. | 438/3 |
| 2005/0098903 A1* | 5/2005 | Yong et al. | 257/786 |
| 2005/0127447 A1* | 6/2005 | Jo | 257/359 |
| 2005/0194683 A1* | 9/2005 | Yu et al. | 257/738 |
| 2005/0245076 A1* | 11/2005 | Bojkov et al. | 438/643 |
| 2006/0001170 A1* | 1/2006 | Zhang et al. | 257/762 |
| 2006/0012046 A1* | 1/2006 | Koura et al. | 257/758 |
| 2006/0166402 A1* | 7/2006 | Lim et al. | 438/108 |
| 2006/0202346 A1* | 9/2006 | Shih et al. | 257/774 |
| 2007/0194450 A1* | 8/2007 | Tyberg et al. | 257/751 |
| 2007/0205520 A1* | 9/2007 | Chou et al. | 257/780 |
| 2009/0057895 A1* | 3/2009 | Lin et al. | 257/737 |

* cited by examiner

METHOD OF FORMING A COPPER TOPPED INTERCONNECT STRUCTURE THAT HAS THIN AND THICK COPPER TRACES

This is a divisional application of application Ser. No. 12/283,852 filed on Sep. 15, 2008 now U.S. Pat. No. 7,709,956 by Abdalla Aly Naem et al.

BACKGROUND OF THE INVENTION

1. Field of the Invention

The present invention relates to an interconnect structure and, more particularly, to a copper-topped interconnect structure that has thin and thick copper traces, and a method of forming the copper-topped interconnect structure.

2. Description of the Related Art

A metal interconnect structure is a multi-layered structure that electrically interconnects together the various devices formed on a semiconductor wafer to realize an electrical circuit. In order to lower the resistance of the interconnect structure, the top layer of the interconnect structure is commonly formed from copper.

FIGS. 1A-1E show a series of cross-sectional views that illustrate a prior-art method 100 of forming a copper-topped interconnect structure. As shown in FIG. 1A, method 100 utilizes a conventionally-formed semiconductor wafer 110 that has an interconnect structure which includes a non-conductive region and a number of conductive structures 112, such as aluminum traces, that touch and sit on the non-conductive region.

As further shown in FIG. 1A, method 100 begins by depositing a layer of passivation material 114 on the non-conductive region and the conductive structures 112. Method 100 continues by forming and patterning a mask 116 on passivation layer 114. Following this, the exposed regions of passivation layer 114 are etched to form a number of openings 120. Some of the openings 120, in turn, expose the conductive structures 112. Mask 116 is then removed.

As shown in FIG. 1B, after mask 116 has been removed, a seed layer 122 is formed on the conductive structures 112 and passivation layer 114. Seed layer 122 typically includes a layer of titanium (e.g., 300 Å thick) and an overlying layer of copper (e.g., 3000 Å thick). The titanium layer enhances the adhesion between the underlying aluminum traces 112 and the overlying layer of copper. (Seed layer 122 can also include an overlying layer of titanium, which is stripped before plating. In addition, seed layer 122 can further include a conductive barrier layer that lies between the aluminum traces 112 and the lower titanium layer.) Next, after seed layer 122 has been formed, a plating mold 124 is formed on seed layer 122 to have a number of openings 126 that expose the number of openings 120.

As shown in FIG. 1C, following the formation of plating mold 124, copper is electroplated to form a number of copper traces 130 in plating mold 124. The copper traces 130, which are electrically connected to the conductive structures 112, are separated from each other by a substantially uniform minimum distance MD. In addition, each copper trace 130 has a top surface 130T and a thickness of approximately 5 μm. After the electroplating process has been completed, plating mold 124 and the seed layer 122 that underlies plating mold 124 are then removed.

Next, as shown in FIG. 1D, a layer of non-conductive material (e.g., benzocyclobutene (BCB) or a polymer) 132 is deposited on passivation layer 114 and the copper traces 130. After non-conductive layer 132 has been deposited, a mask 134 is formed on non-conductive layer 132. Following this, the exposed regions of non-conductive layer 132 are etched to form openings 136 that expose the copper traces 130. Mask 134 is then removed.

As shown in FIG. 1E, after the openings 136 in non-conductive layer 132 have been formed, a metal layer 138 is formed on non-conductive layer 132 to fill up the openings 134 and contact the copper traces 130. Metal layer 138 can be implemented with, for example, gold or aluminum with an underlying titanium layer. The titanium layer enhances the adhesion of the aluminum to the copper.

After this, a mask 140 is formed and patterned on metal layer 138. Next, the exposed regions of metal layer 138 are etched to form a number of metal bond pads 142 over selected regions of the top surfaces of the copper traces 130. Mask 140 is then removed. After mask 140 has been removed, solder balls can be attached to the metal bond pads 142 or, alternately, bonding wires can be attached to the metal bond pads 142.

Although method 100 provides an approach to forming a copper-topped interconnect structure, there is a need for additional methods of forming copper-topped interconnect structures.

DETAILED DESCRIPTION OF THE INVENTION

FIGS. 2A-2I show a series of cross-sectional views that illustrate a method 200 of forming a copper-topped interconnect structure in accordance with the present invention. As described in greater detail below, the present invention allows the combination of high density design areas, which do not require high current metal traces, with low density design areas, which require high current metal traces. As a result, the present invention allows thin and narrow metal traces to be combined with thick and wide metal traces on the same chip.

Figure 1A:
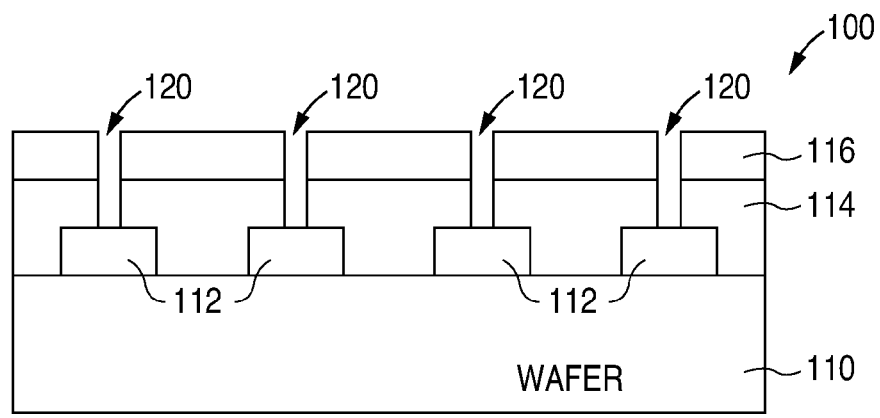
FIGS. 1A-1E are a series of cross-sectional views taken along a common straight cut plane illustrating a prior art method 100 of forming a copper-topped interconnect structure.
Figure 1B:
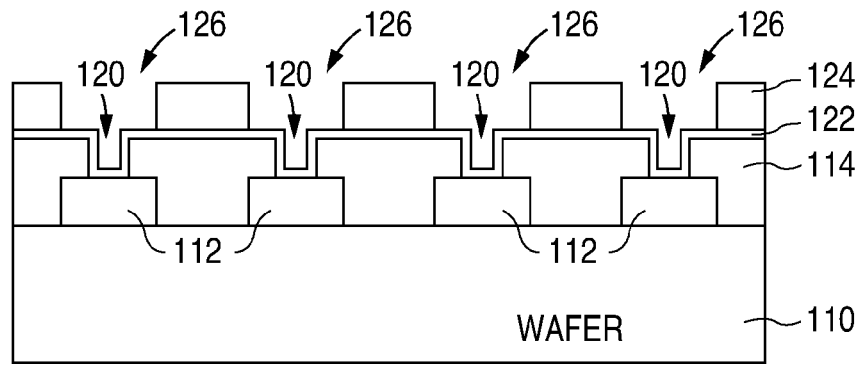
Figure 1C:
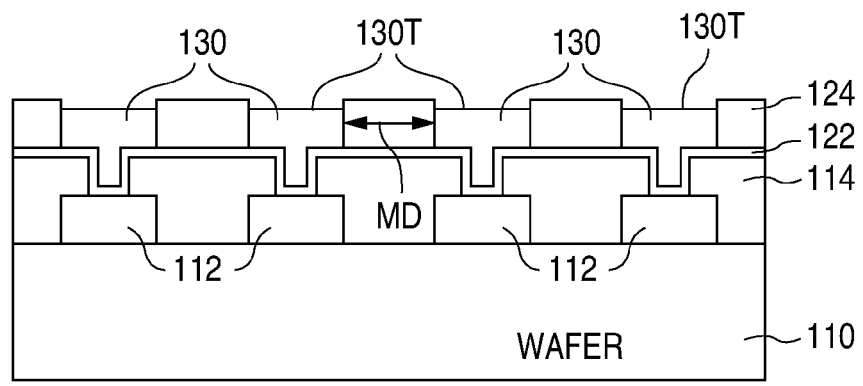
Figure 1D:
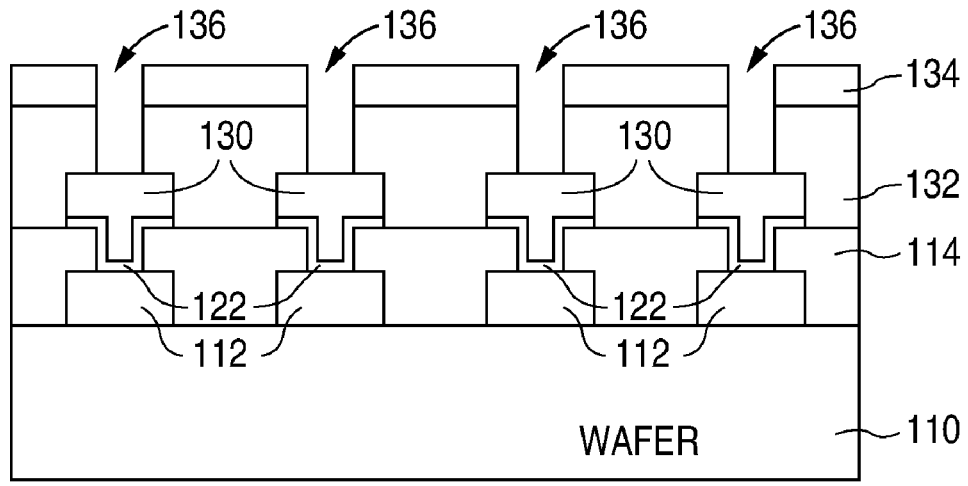
Figure 1E:
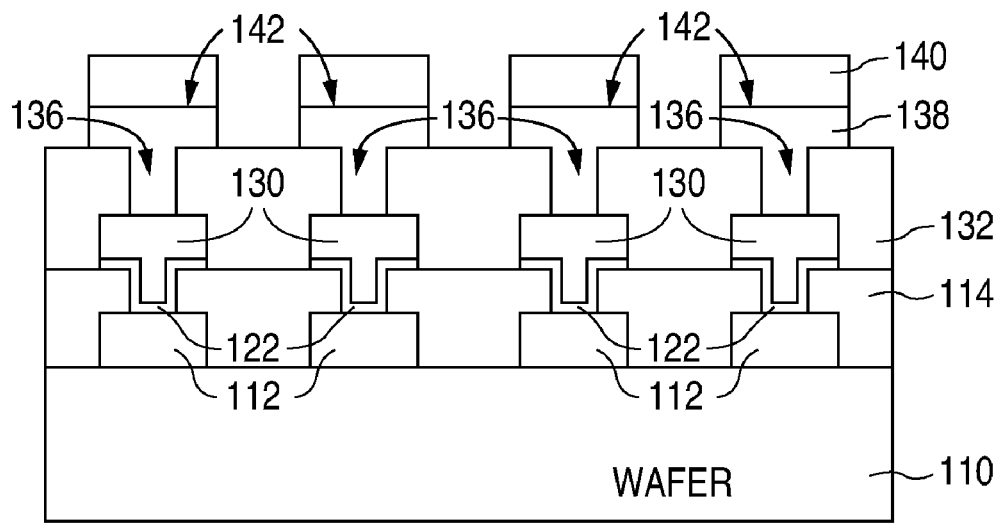
Figure 2A:
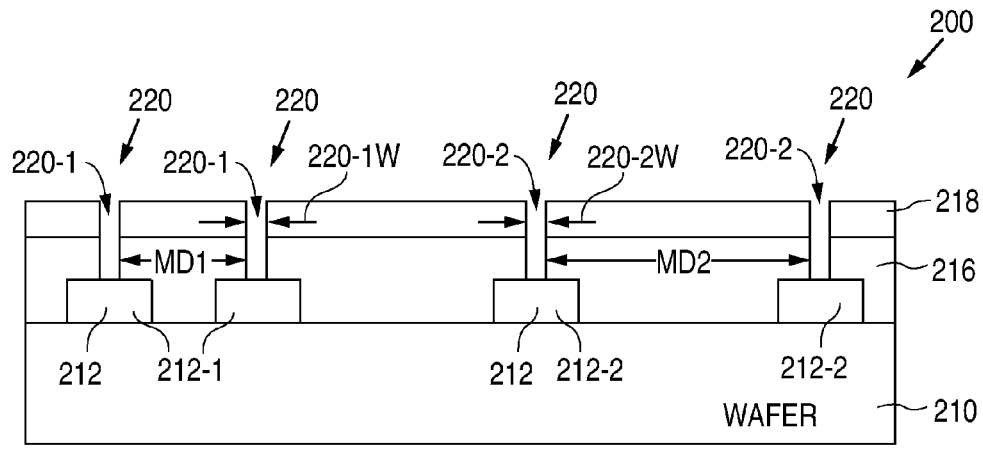
FIGS. 2A-2I are a series of cross-sectional views taken along a common straight cut plane illustrating a method 200 of forming a copper-topped interconnect structure in accordance with the present invention.

As shown in FIG. 2A, method 200 utilizes a conventionally-formed semiconductor wafer 210 that has an interconnect structure which includes a non-conductive region and a number of conductive structures 212, such as aluminum traces, that touch and sit on the non-conductive region. The conductive structures 212, in turn, include a number of first conductive structures 212-1 and a number of second conductive structures 212-2 that are to carry substantially more current than the first conductive structures 212-1.

As further shown in FIG. 2A, method 200 begins by depositing a layer of passivation material 216 on the non-conductive region and the conductive structures 212. Method 200 continues by forming and patterning a mask 218 on passivation layer 216. Following this, the exposed regions of passivation layer 216 are etched to form a number of openings 220.

The openings 220 include a number of first openings 220-1 that are each separated from an adjacent first opening 220-1 by a first minimum distance MD1. In addition, as shown in FIG. 2A, the first openings 220-1 expose the first conductive structures 212-1. The openings 220 also include a number of second openings 220-2 that are each separated from an adjacent second opening 220-2 by a minimum distance MD2. In addition, as further shown in FIG. 2A, the second openings 220-2 expose the second conductive structures 212-2. The first and second openings 220-1 and 220-2, in turn, have cross-sectional widths 220-1W and 220-2W, respectively. The cross-sectional widths 220-2W can be larger than the cross-sectional widths 220-1W as needed to carry a larger current. Mask 218 is then removed.

Figure 2B:
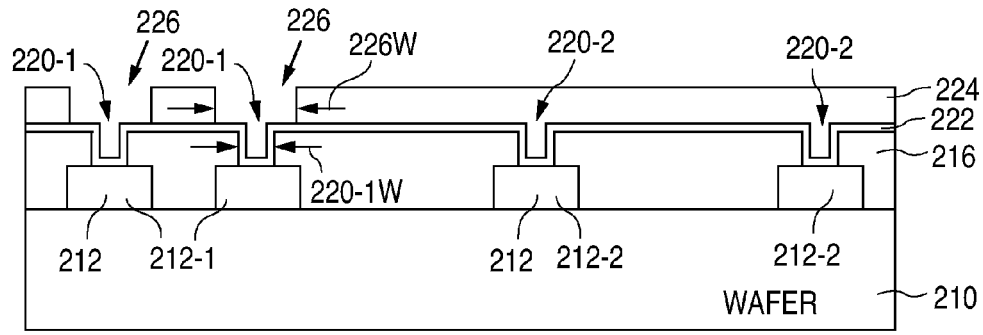

As shown in FIG. 2B, after mask 218 has been removed, a seed layer 222 is formed on the conductive structures 212 and passivation layer 216. Seed layer 222 typically includes a layer of titanium (e.g., 300 Å thick) and an overlying layer of copper (e.g., 3000 Å thick). The titanium layer enhances the adhesion between the underlying aluminum traces 212 and the overlying layer of copper. (Seed layer 222 can also include an overlying layer of titanium (Ti—Cu—Ti), which is stripped before plating. In addition, seed layer 222 can also include a conductive barrier layer that lies between the aluminum traces 212 and the lower titanium layer.)

Next, a plating mold 224 is formed on seed layer 222 to have a number of openings 226 that expose the number of first openings 220-1. Each opening 226, in turn, has a cross-sectional width 226W. The cross-sectional width 226W, which is substantially greater than the cross-sectional width 220-1W, is measured along the same straight cut plane as the cross-sectional width 220-1W. In accordance with the present invention, as further shown in FIG. 2B, plating mold 224 covers and protects the second openings 220-2 and the portion of seed layer 222 that is formed in the second openings 220-2.

Figure 2C:
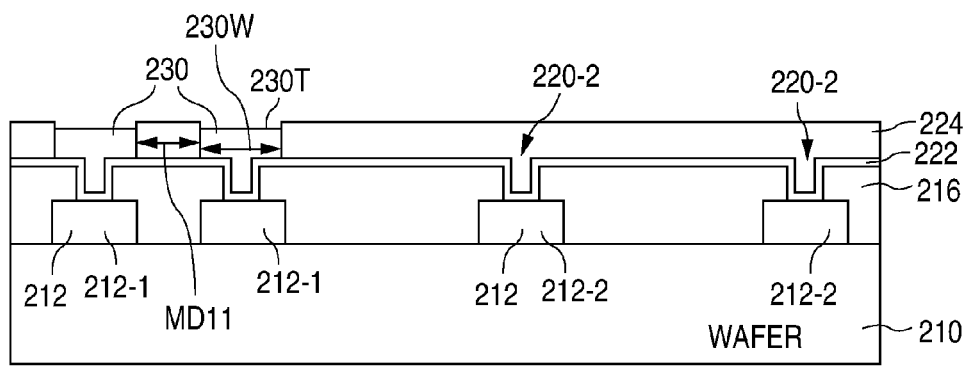

As shown in FIG. 2C, following the formation of plating mold 224, copper is electroplated to form a number of first copper traces 230 in plating mold 224. Although trace materials may be present, the electroplated first copper traces 230 are substantially only copper. The first copper traces 230, some of which are electrically connected to the first conductive structures 212-1, are each separated from an adjacent first copper trace 230 by a minimum distance MD11.

In addition, each first copper trace 230 has a cross-sectional width 230W, a top surface 230T, and a thickness of, for example, 5 µm. The cross-sectional width 230W of a first copper trace 230 is measured normal to a length of the first copper trace 230 and normal to a thickness of the first copper trace 230. After the electroplating process has been completed, plating mold 224 is removed.

Figure 2D:
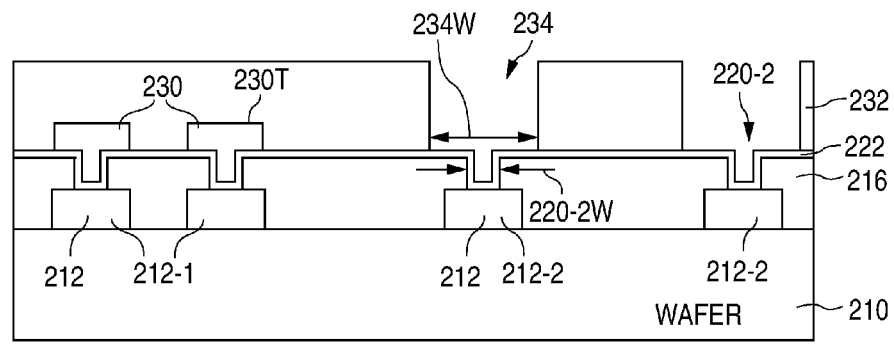

Next, as shown in FIG. 2D, following the removal of plating mold 224, a plating mold 232 is formed on seed layer 222 and the first copper traces 230 to have a number of openings 234 that expose the number of second openings 220-2. Plating mold 232, in turn, is substantially thicker than plating mold 224.

Each opening 234 has a cross-sectional width 234W. The cross-sectional width 234W, which is substantially greater than the cross-sectional width 220-2W, is measured along the same straight cut plane as the cross-section width 220-2W. In accordance with the present invention, as further shown in FIG. 2D, plating mold 232 covers and protects the first copper traces 230. In addition, the cross-sectional widths 234W of the openings 234 in plating mold 232, which are measured along the same straight cut plane as the cross-sectional widths 226W, are substantially larger than the cross-sectional widths 226W of the openings 226 in plating mold 224.

Figure 2E:
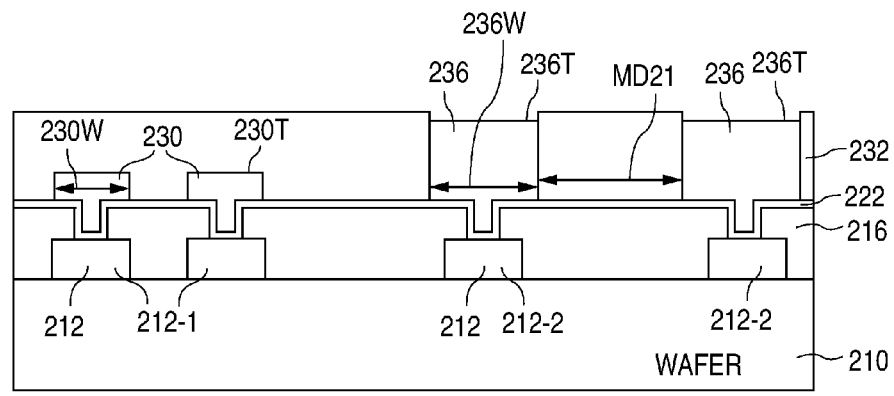

As shown in FIG. 2E, following the formation of plating mold 232, copper is electroplated to form a number of second copper traces 236 in plating mold 232. Although trace materials may be present, the electroplated second copper traces 236 are substantially only copper. The second copper traces 236, some of which are electrically connected to the second conductive structures 212-2, are each separated from an adjacent second copper trace 236 by a minimum distance MD21.

In addition, each second copper trace 236 has a cross-sectional width 236W, a top surface 236T, and a thickness of, for example, 15 µm. The cross-sectional width 236W of a second copper trace 236 is measured normal to a length of the second copper trace 236 and normal to a thickness of the second copper trace 236. The minimum cross-sectional widths of the portions of the second copper traces 236 that lie completely above passivation layer 216 are substantially greater than the minimum cross-sectional widths of the portions of the first copper traces 230 that lie completely above passivation layer 216.

Further, as further shown in FIG. 2E, the cross-sectional width 236W, which is substantially greater than the cross-section width 230W, is measured along the same straight cut plane as the cross-section width 230W. Further, the minimum distance MD21, which is measured along the same straight cut plane as minimum distance MD11, is substantially greater than minimum distance MD11. After the electroplating process has been completed, plating mold 232 and the underlying regions of seed layer 222 are removed.

Figure 2F:
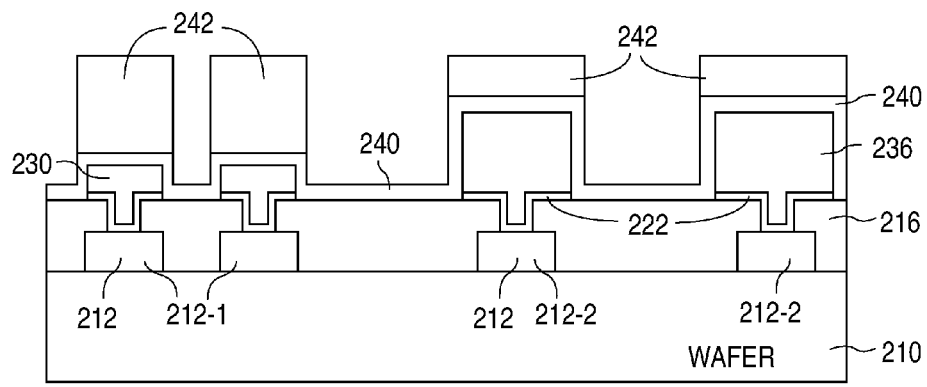

As shown in FIG. 2F, after plating mold 232 and the underlying regions of seed layer 222 have been removed, a conductive barrier layer 240 can be optionally deposited over passivation layer 216, the first copper traces 230, and the second copper traces 236. Barrier layer 240, which can be implemented with, for example, aluminum-copper, cobalt, nickel, and/or gold, allow non-copper wire bonding lines or non-copper solder balls to be attached to the copper traces 230 and 236, and can also provide resistance to humidity and corrosion.

Figure 2G:
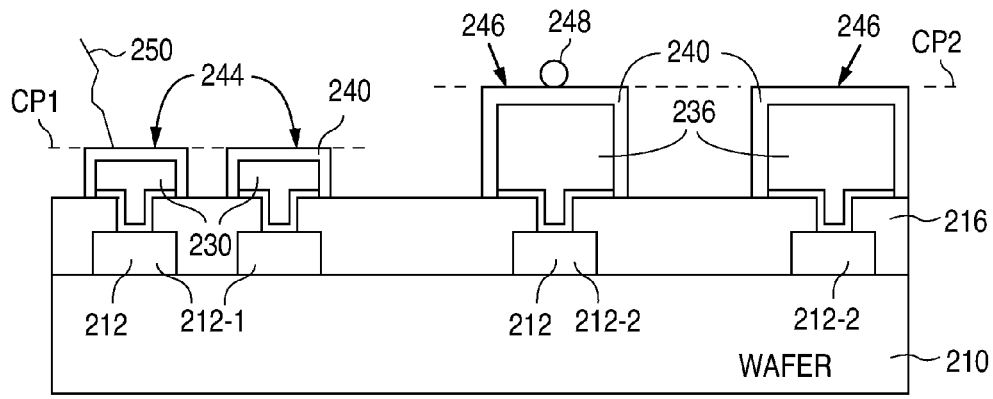

Following this, after barrier layer 240 has been formed, a mask 242 is then formed and patterned on barrier layer 240. Next, as shown in FIG. 2G, the exposed regions of barrier layer 240 are removed from the top surface of passivation layer 216 to form a number of sealed first copper traces 244 and a number of sealed second copper traces 246. Mask 242 is then removed. Thus, as shown in FIG. 2G, the copper traces 230 have top surfaces that all lie substantially in a first common plane CP1, while the copper traces 236 have top surfaces that all lie substantially in a second common plane CP2 that lies substantially above the first common plane CP1.

After mask 242 has been removed, solder balls 248 can be attached to selected regions on the copper traces 230 and 236 as illustrated in FIG. 2G, or thin bonding wires 250 can be attached to the copper traces 230 and 236 as alternately illustrated in FIG. 2G. Solder balls 248 or bonding wires 250 can alternately be connected to the copper traces 230 and 236 if barrier layer 240 is not used.

Figure 2H:
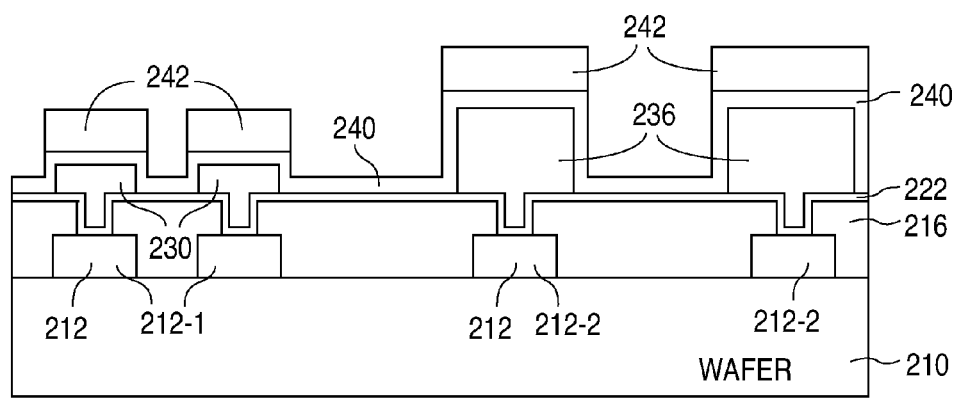
Figure 2I:
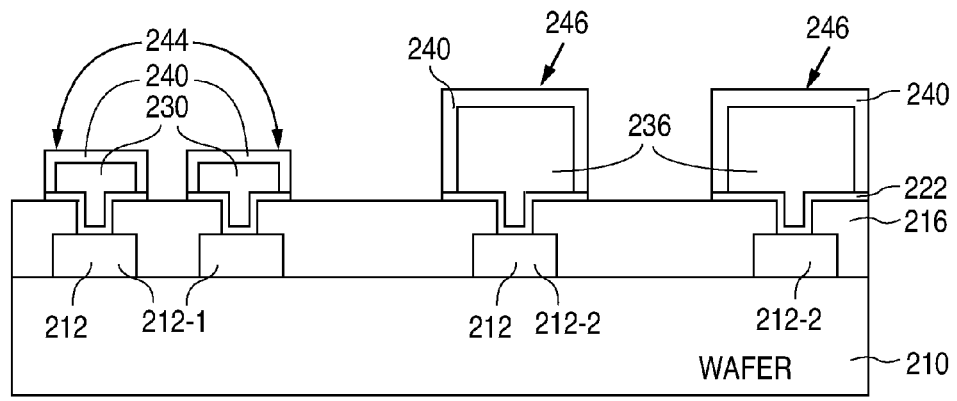

Alternately, as shown in FIG. 2H, plating mold 232 can be removed without removing the underlying regions of seed layer 222, followed by the deposition of barrier layer 240 over seed layer 222, the first copper traces 230, and the second copper traces 236. Mask 242 is then formed as above. After this, as shown in FIG. 2I, the exposed regions of barrier layer 240 and the underlying seed layer 222 are removed from the top surface of passivation layer 216 to form the first and second sealed copper traces 244 and 246. Mask 242 is then removed.

Thus, a method of forming a copper-topped metal interconnect structure has been described. One of the advantages of the present invention is that a chip can be implemented with both high density design areas which do not require high current metal traces, and low density design areas which require high current metal traces. For example, traces with low current requirements can be implemented with copper traces 230 that require a relatively small minimum distance, such as 5 µm, while traces with high current requirements can be implemented with copper traces 236 that require a relatively large minimum distance, such as 15 µm.

When compared to prior art copper structures which only utilize traces with a small minimum distance between adjacent traces, the present invention substantially reduces the resistance of the high current traces. When compared to prior art copper structures which only utilize traces with a large minimum distance between traces, the present invention allows more low current traces to be formed in the same physical space, thereby increasing the routing density.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a semiconductor structure comprising:
    forming an isolation structure that touches a plurality of first metal structures and a plurality of second metal structures;
    wherein an adjacent pair of first metal structures are spaced apart by a first minimum distance, an adjacent pair of second metal structures are spaced apart by a second minimum distance, the second minimum distance being greater than the first minimum distance;
    simultaneously forming a plurality of first isolation openings and a plurality of second isolation openings in the isolation structure, the plurality of first isolation openings exposing the plurality of second isolation openings exposing the plurality of second metal structures;
    forming a seed layer that touches the isolation structure, the plurality of first metal structures, and the plurality of second metal structures; and
    forming a first plating mold that touches the seed layer, the first plating mold having a plurality of first mold openings that expose the seed layer that lies directly over the plurality of first metal structures, the first plating mold covering the seed layer that lies directly over the plurality of second metal structures;
    forming a plurality of first plated structures in the plurality of first mold openings in the first plating mold, wherein the plurality of first plated structures are substantially only copper;
    removing the first plating mold; and
    forming a second plating mold that touches the seed layer, the second plating mold having a plurality of second mold openings that expose the seed layer that lies directly over the plurality of second metal structures, the second plating mold covering the plurality of first plated structures.

2. The method of claim 1 wherein the second plating mold is thicker than the first plating mold.

3. The method of claim 1 and further comprising forming a plurality of second plated structures in the plurality of second mold openings in the second plating mold.

4. The method of claim 3 wherein the plurality of second plated structures are substantially only copper.

5. The method of claim 3 wherein a portion of a first plated structure that lies above the isolation structure has a first minimum width, a portion of a second plated structure that lies above the isolation structure has a second minimum width, the second minimum width being greater than the first minimum width.

6. The method of claim 3 wherein a thickness of each of the plurality of second plated structures is greater than a thickness of each of the plurality of first plated structures.

7. The method of claim 3 and further comprising removing the second plating mold to expose a region of the seed layer that lies directly below the second plating mold.

8. The method of claim 7 and further comprising:
    removing the region of the seed layer; and
    forming a sealant layer that touches the isolation structure, the plurality of first plated structures, and the plurality of second plated structures.

9. The method of claim 8 and further comprising:
    removing the sealant layer from a portion of the isolation structure to form a plurality of first sealed plated structures and a plurality of second sealed plated structures; and
    forming a plurality of solder balls that touch the plurality of first sealed plated structures and the plurality of second sealed plated structures.

10. The method of claim 8 and further comprising:
    removing the sealant layer from a portion of the isolation structure to form a plurality of first sealed plated structures and a plurality of second sealed plated structures; and
    forming a plurality of bonding wires that touch the plurality of first sealed plated structures and the plurality of second sealed plated structures.

11. The method of claim 7 and further comprising:
    forming a sealant layer that touches the region of the seed layer, the plurality of first plated structures, and the plurality of second plated structures;
    removing the sealant layer and a portion of the region of the seed layer to expose a portion of the isolation structure and form a plurality of first sealed plated structures and a plurality of second sealed plated structures; and
    forming a plurality of solder balls that touch the plurality of first sealed plated structures and the plurality of second sealed plated structures.

12. The method of claim 7 and further comprising:
    forming a sealant layer that touches the region of the seed layer, the plurality of first plated structures, and the plurality of second plated structures;
    removing the sealant layer and a portion of the region of the seed layer to expose a portion of the isolation structure and form a plurality of first sealed plated structures and a plurality of second sealed plated structures; and
    forming a plurality of bonding wires that touch the plurality of first sealed plated structures and the plurality of second sealed plated structures.

* * * * *